Figure 1:
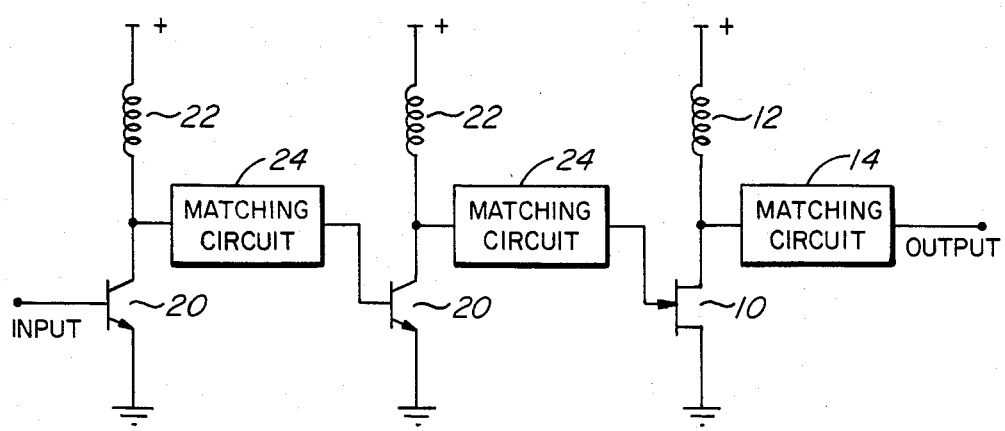

United States Patent [19]

Bura

[11] Patent Number: 4,535,304
[45] Date of Patent: Aug. 13, 1985

[54] HIGH FREQUENCY AMPLIFIER WITH PHASE COMPENSATION

[75] Inventor: Paul Bura, Montreal, Canada

[73] Assignee: Northern Telecom Limited, Montreal, Quebec, Canada

[21] Appl. No.: 602,210

[22] Filed: Apr. 19, 1984

[30] Foreign Application Priority Data

Apr. 2, 1984 [CA] Canada ................................. 451108

[51] Int. Cl.³ .............................................. H03F 3/16
[52] U.S. Cl. ..................................... 330/300; 330/311
[58] Field of Search ................. 330/277, 300, 310, 311

[56] References Cited

U.S. PATENT DOCUMENTS 3,392,343  7/1968  Mullins ................................ 330/300
3,974,455  8/1976  Kamimura et al. ................. 330/300

FOREIGN PATENT DOCUMENTS 2021892  12/1979  United Kingdom ................ 330/277

Primary Examiner—James B. Mullins
Assistant Examiner—G. Wan
Attorney, Agent, or Firm—R. John Haley

[57] ABSTRACT

Positive phase changes with increasing signal level in a high frequency Schottky-gate FET amplifier stage are compensated for by coupling, via an impedance matching circuit, at least one bipolar transistor amplifier stage in cascade with the FET stage. The resultant amplifier is particularly useful in a microwave radio transmitter for a digital radio transmission system.

6 Claims, 2 Drawing Figures

HIGH FREQUENCY AMPLIFIER WITH PHASE COMPENSATION

This invention relates to high frequency amplifiers.

It is known to use Schottky-gate field-effect transistors (also known as metal semiconductor field-effect transistors, or MESFETs) in high frequency power amplifiers, such as used for example in a transmitter for a digital microwave radio transmission system. A problem arises, however, in that at high radio frequency (RF) drive levels such transistors exhibit a phase change which varies with the drive level, and consequent signal distortion due to slight changes in the channel width producing different transit times, and due to other possible effects.

In order to reduce phase changes with varying RF drive levels, higher power Schottky-gate FETs have been used, with the consequent disadvantages of higher costs and greater power dissipation.

An object of this invention, therefore, is to provide an improved high frequency amplifier.

According to this invention there is provided a high frequency amplifier comprising a plurality of cascaded amplifier stages, wherein at least one of said stages comprises a Schottky-gate field-effect transistor amplifier stage which produces a positive phase change with increasing signal level, and at least one other of said stages comprises a bipolar transistor amplifier stage which produces a negative phase change with increasing signal level, said negative phase change compensating for said positive phase change.

Conveniently said amplifier stages comprise a single Schottky-gate field-effect transistor amplifier stage and a plurality of bipolar transistor amplifier stages.

Preferably said amplifier stages are cascaded by means of at least one impedance matching circuit coupled between the stages.

The invention also extends to a method of compensating for positive phase changes with increasing signal level in a high frequency Schottky-gate field-effect transistor amplifier stage, comprising the step of coupling at least one bipolar transistor amplifier stage in cascade with said Schottky-gate field-effect transistor amplifier stage.

Figure 2:
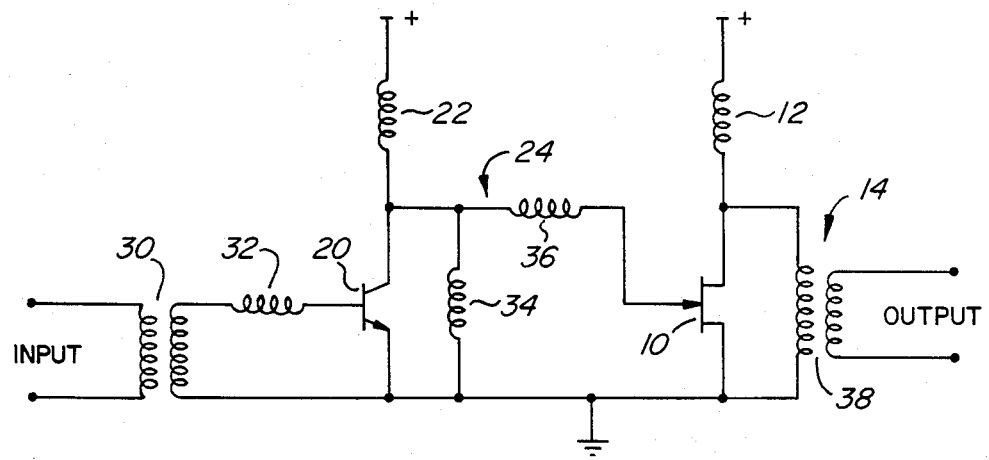

The invention will be further understood from the following description with reference to the accompanying drawings, in which:

FIG. 1 schematically illustrates a circuit of an embodiment of the invention; and FIG. 2 schematically illustrates coupled bipolar transistor and FET stages for the circuit of FIG. 1.

For clarity in the drawings, d.c. biassing circuits for the various transistors are not shown; these are of course provided in known manner.

Referring to FIG. 1, there is shown part of a high frequency (e.g. RF microwave) power amplifier which includes a Schottky-gate FET 10 having an inductor 12, acting as an RF choke, in its drain circuit which is coupled to an output of the amplifier via an impedance matching circuit 14.

As is known, increasing RF drive levels to the gate of the FET 10 lead to phase changes which are dependent on the instantaneous RF signal level, and consequent signal distortion. In the prior art this has been accommodated by using high power FETs, which are very expensive, and driving them at levels well below their capabilities.

It is believed that the phase change with increasing RF signal level arises from a slightly increased channel opening, with a consequent shortening of the carrier transit length, and hence transit time, between the source and drain of the FET. Thus for positive half-cycles of an RF signal the transit time is shorter (positive phase change) than for negative half-cycles. It is also believed that the RF drive level affects the space charge domain in the gate-drain region, reducing this with a consequent reduction in transit time as the drive level increases.

In accordance with this invention, the above phase change is compensated for by connecting one or more bipolar transistor stages in cascade with one or more FET stages. For example, FIG. 1 shows two bipolar transistor stages connected in cascade with the FET stage preceding the FET stage (they could aternatively follow the FET stage). These bipolar transistor stages provide an opposite phase change which is dependent on the RF drive level, thereby reducing the overall phase change of the amplifier. The relative numbers and biassing of the bipolar transistor stages and FET stages are selected to minimize the overall phase change. For example, in a constructed embodiment of the invention there were four bipolar transistor stages coupled in cascade with one FET stage. The negative phase change with increasing RF drive level in each bipolar transistor stage is believed to be due to the current gain of the transistor being dependent on the base current, so that increases in collector current during positive half-cycles are smaller than decreases in collector current during negative half-cycles of an RF signal applied to the base. In other words, the average collector current decreases with an increasing RF drive level. This decreasing average collector current increases the reverse voltage across the collector junction, with a corresponding increase in the depletion layer width and a resultant increase in depletion layer transit time, and hence a negative phase change.

Referring again to FIG. 1, each of the two bipolar transistor stages comprises a bipolar transistor 20, a collector load inductor 22 acting as an RF choke, and an impedance matching circuit 24 from the collector of the transistor to the input of the next stage. The base of the transistor 20 forms the input of the respective stage, the input of the first stage being an input of the amplifier. As explained above, the bias of the bipolar transistors 20 and the FET 10 can be adjusted to provide relatively little phase change over a desired range of RF signal drive levels. Furthermore, this bias adjustment can be performed in order to compensate for gain variations with RF drive level, whereby the power amplifier operates more linearly over its operating range.

FIG. 2 illustrates possible forms of matching circuits which may be used to couple cascaded bipolar transistor and FET stages together and to the input and output of the amplifier. Similar references are used in FIG. 2 to denote components similar to those of FIG. 1.

As illustrated in FIG. 2, the amplifier input is provided with a desired impedance of for example 50 ohms by a matching impedance transformer 30, which is coupled to the base of a bipolar transistor 20 via a tuning or resonating inductor 32. A matching circuit 24, between the collector of the transistor 20 and the gate of a Schottky-gate FET 10, comprises a step-up transformer formed by a shunt tuning inductor 34 and a series inductor 36. The drain output of the FET is matched to a desired output impedance of for example 50 ohms by means of an impedance matching transformer 38 which constitutes the matching circuit 14. The transformers and inductors are conveniently, but not necessarily, constituted by transmission line sections which are tuned for a flat gain across the frequency range of operation of the amplifier.

Although not illustrated in the drawings, the cascaded stages may optionally be coupled together via isolators, especially if there is a large number of cascaded stages. Numerous other modifications, variations, and adaptations may be made to the described embodiment of the invention without departing from the scope of the invention which is defined by the claims.

What is claimed is:

1. A high frequency amplifier comprising a plurality of cascaded amplifier stages, wherein at least one of said stages comprises a Schottky-gate field-effect transistor amplifier stage which produces a positive phase change with increasing signal level, and at least one other of said stages comprises a bipolar transistor amplifier stage which produces a negative phase change with increasing signal level, said negative phase change compensating for said positive phase change.

2. A high frequency amplifier as claimed in claim 1 wherein said amplifier stages comprise a single Schottky-gate field-effect transistor amplifier stage and a plurality of bipolar transistor amplifier stages.

3. A high frequency amplifier as claimed in claim 1 wherein said amplifier stages are cascaded by means of at least one impedance matching circuit coupled between the stages.

4. A high frequency amplifier as claimed in claim 2 wherein said amplifier stages are cascaded by means of at least one impedance matching circuit coupled between the stages.

5. A method of compensating for positive phase changes with increasing signal level in a high frequency Schottky-gate field-effect transistor amplifier stage, comprising the step of coupling at least one bipolar transistor amplifier stage in cascade with said Schottky-gate field-effect transistor amplifier stage.

6. A method as claimed in claim 5 wherein said stages are coupled in cascade via an impedance matching circuit.

* * * * *